(12) United States Patent
Kim et al.

(10) Patent No.: US 9,747,998 B2
(45) Date of Patent: Aug. 29, 2017

(54) TEST METHOD OF SEMICONDUCTOR MEMORY DEVICE AND SEMICONDUCTOR MEMORY SYSTEM TRANSFERRING FAIL ADDRESS DATA FROM A VOLATILE TO A NON-VOLATILE MEMORY ARRAY USING AN ERROR-CORRECTION CODE ENGINE

(71) Applicant: Samsung Electronics Co., Ltd., Suwon-Si, Gyeonggi-Do (KR)

(72) Inventors: Sua Kim, Seongnam-si (KR); Dongsoo Kang, Hwaseong-si (KR); Chulwoo Park, Yongin-si (KR); Jun Hee Yoo, Ansan-si (KR); Hak-Soo Yu, Seongnam-si (KR); Jaeyoun Youn, Seoul (KR); Sung Hyun Lee, Gwangju-si (KR); Jinsu Jung, Suwon-si (KR); Hyojin Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/462,843

(22) Filed: Aug. 19, 2014

(65) Prior Publication Data

US 2015/0155055 A1 Jun. 4, 2015

(30) Foreign Application Priority Data

Nov. 29, 2013 (KR) .................. 10-2013-0147480

(51) Int. Cl.
*G11C 17/16* (2006.01)
*G11C 29/02* (2006.01)
(Continued)

(52) U.S. Cl.
CPC .............. *G11C 17/16* (2013.01); *G11C 17/18* (2013.01); *G11C 29/027* (2013.01); *G11C 29/42* (2013.01);
(Continued)

(58) Field of Classification Search
CPC ....... G11C 17/16; G11C 29/44; G11C 29/027; G11C 29/4401; G11C 29/42; G11C 2029/4402
(Continued)

(56) References Cited

U.S. PATENT DOCUMENTS 5,357,473 A 10/1994 Mizuno et al.
6,199,177 B1 * 3/2001 Blodgett .............. G11C 29/846
714/6.32
(Continued)

FOREIGN PATENT DOCUMENTS

JP 2006085769 A 3/2006
JP 2006209884 A 8/2006
(Continued)

*Primary Examiner* — Vanthu Nguyen
*Assistant Examiner* — Jerome Leboeuf
(74) *Attorney, Agent, or Firm* — Harness, Dickey & Pierce, PLC

(57) ABSTRACT

A test method of the semiconductor memory device including a memory cell array and an anti-fuse array includes detecting failed cells included in the memory cell array; determining a fail address corresponding to the detected failed cells; storing the determined fail address in a first region of the memory cell array; and reading the fail address stored in the first region to program the read fail address in the anti-fuse array. According to the test method of a semiconductor memory device and the semiconductor memory system, since the test operation can be performed (Continued)

without an additional memory for storing an address, the semiconductor memory device and the test circuit can be embodied by a small area.

16 Claims, 12 Drawing Sheets

(51) Int. Cl.
  *G11C 29/42* (2006.01)
  *G11C 29/44* (2006.01)
  *G11C 17/18* (2006.01)
(52) U.S. Cl.
  CPC .......... *G11C 29/44* (2013.01); *G11C 29/4401* (2013.01); *G11C 2029/4402* (2013.01)
(58) Field of Classification Search
  USPC ........................................ 365/225.7, 96, 200
  See application file for complete search history.

(56) References Cited

U.S. PATENT DOCUMENTS

| | | | |
|---|---|---|---|
| 6,320,804 B2 | 11/2001 | Dahn | |
| 6,421,286 B1 | 7/2002 | Ohtani et al. | |
| 6,617,842 B2 | 9/2003 | Nishikawa et al. | |
| 7,137,055 B2 | 11/2006 | Hirano et al. | |
| 7,602,659 B2 | 10/2009 | Kang | |
| 7,773,438 B2 | 8/2010 | Fekih-Romdhane | |
| 9,087,613 B2* | 7/2015 | Sohn | G06F 11/27 |
| 2001/0005132 A1 | 6/2001 | Nishikawa et al. | |
| 2001/0006481 A1 | 7/2001 | Daehn | |
| 2005/0149803 A1 | 7/2005 | Hirano et al. | |
| 2005/0243617 A1 | 11/2005 | Kang | |
| 2007/0113121 A1* | 5/2007 | Hummler | G11C 29/44 714/710 |
| 2008/0282107 A1* | 11/2008 | Hung | G11C 29/56 714/6.13 |
| 2009/0303813 A1 | 12/2009 | Fekih-Romdhane | |
| 2010/0157703 A1* | 6/2010 | Fischer | G11C 29/027 365/200 |
| 2012/0249157 A1 | 10/2012 | Kosugi et al. | |
| 2012/0297257 A1 | 11/2012 | Mohr et al. | |
| 2013/0028009 A1* | 1/2013 | Kim | G11C 11/16 365/158 |
| 2013/0179751 A1* | 7/2013 | Linstadt | G06F 11/1048 714/763 |
| 2013/0227344 A1* | 8/2013 | Sohn | G06F 11/27 714/6.21 |
| 2014/0258780 A1* | 9/2014 | Eyres | G11C 29/16 714/30 |

FOREIGN PATENT DOCUMENTS

| | | |
|---|---|---|
| KR | 19990035774 A | 5/1999 |
| KR | 20010062640 A | 7/2001 |
| KR | 20020017771 A | 3/2002 |
| KR | 20020066946 A | 8/2002 |
| KR | 20030002430 A | 1/2003 |
| KR | 100587076 B1 | 6/2006 |
| KR | 100746389 B1 | 8/2007 |
| KR | 100933839 B1 | 12/2009 |
| KR | 20120113183 A | 10/2012 |
| WO | WO-9818133 A1 | 4/1998 |

* cited by examiner

TEST METHOD OF SEMICONDUCTOR MEMORY DEVICE AND SEMICONDUCTOR MEMORY SYSTEM TRANSFERRING FAIL ADDRESS DATA FROM A VOLATILE TO A NON-VOLATILE MEMORY ARRAY USING AN ERROR-CORRECTION CODE ENGINE

CROSS-REFERENCE TO RELATED APPLICATIONS

A claim for priority under 35 U.S.C. §119 is made based on Korean Patent Application No. 10-2013-0147480, filed on Nov. 29, 2013, in the Korean Intellectual Property Office, the entire contents of which are hereby incorporated by reference.

BACKGROUND

At least one example embodiment of the inventive concepts relates to a test method of a semiconductor memory device and a semiconductor memory system performing the test operation.

A semiconductor memory device is a memory device which is embodied using a semiconductor. Examples of such semiconductors include silicon Si, germanium Ge, gallium arsenide GaAs, indium phosphide InP, etc. Semiconductor memory devices are classified into volatile memory devices and nonvolatile memory devices.

A volatile memory device loses its stored data when its power supply is interrupted. Examples of the volatile memory device include a static RAM (SRAM), a dynamic RAM (DRAM), a synchronous DRAM (SDRAM), etc.

A DRAM includes a plurality of memory cells being arranged in a matrix form. As the integration and the speed of semiconductor memory devices increases, a ratio of cells of the semiconductor memory devices which are failed cells that do not operate correctly is increasing. To improve yield of a semiconductor memory device, a method of efficiently repairing a failed cell may be desirable.

SUMMARY

At least one example embodiment of the inventive concepts provides a test method of a semiconductor memory device including a memory cell array and an anti-fuse array includes detecting one or more failed cells included in the memory cell array; determining a fail address corresponding to the detected one or more failed cells; storing the determined fail address in a first region of the memory cell array; reading the fail address stored in the first region; and programming the read fail address in the anti-fuse array.

According to at least one example embodiment of the inventive concepts, the first region is included in a redundancy cell array.

According to at least one example embodiment of the inventive concepts, the test method further includes performing a pin setting operation to access the first region.

According to at least one example embodiment of the inventive concepts, the test method further includes encoding the determined fail address, wherein the storing the determined fail address in the first region of the memory cell array includes storing the encoded fail address in the first region.

According to at least one example embodiment of the inventive concepts, the encoding the determined fail address is performed using an error-correcting code (ECC) engine included in the semiconductor memory device.

According to at least one example embodiment of the inventive concepts, the reading the fail address stored in the first region includes, decoding the read fail address, and verifying whether or not an error exists in the fail address during the decoding operation, and wherein the programming the fail address includes, programming the decoded fail address in the anti-fuse array.

According to at least one example embodiment of the inventive concepts, the decoding the read fail address is performed using an error-correcting code (ECC) engine included in the semiconductor memory device.

According to at least one example embodiment of the inventive concepts, the test method further includes comparing data programmed in the anti-fuse array with data read from the first region to verify whether or not an error exists in the data programmed in the anti-fuse array.

According to at least one example embodiment of the inventive concepts, the test method further includes generating a repair address using the programmed anti-fuse array; and retesting whether failed cells included in the memory cell array are repaired using the repair address.

At least one example embodiment of the inventive concepts provides a semiconductor memory system including a semiconductor memory device including a memory cell array and an anti-fuse array; and a test circuit configured to detect a fail address corresponding to failed cells in the memory cell array, control the semiconductor memory device so that the detected fail address is stored in a redundancy cell array included in the memory cell array and read the fail address stored in the redundancy cell array to program the read fail address in the anti-fuse array.

According to at least one example embodiment of the inventive concepts, the test circuit further includes an ECC engine configured to encode the detected fail address and control the semiconductor memory device so that the encoded fail address is stored in the redundancy cell array.

According to at least one example embodiment of the inventive concepts, the test circuit is configured to decode the fail address read from the redundancy cell array using the ECC engine and programs the decoded fail address in the anti-fuse array.

According to at least one example embodiment of the inventive concepts, the test circuit is configured to perform a verify operation on the read fail address using the ECC engine while the read fail address is decoded.

According to at least one example embodiment of the inventive concepts, the test circuit is configured to perform a verify operation on the data programmed in the anti-fuse array by comparing data programmed in the anti-fuse array with data read from the redundancy cell array.

According to at least one example embodiment of the inventive concepts, the test circuit is configured to perform a retest on the memory cell array using the anti-fuse array in which the fail address is programmed.

At least one example embodiment of the inventive concepts provides a method of operating a semiconductor memory device test circuit including performing a first test operation by using the test circuit to detect one or more failed cells included in a memory cell array of a semiconductor memory device; determining a fail address corresponding to the detected one or more failed cells; storing the determined fail address in a first region of the memory cell array; and performing a programming operation by using the test circuit to program the stored fail address in an anti-fuse array of the semiconductor memory device.

According to at least one example embodiment of the inventive concepts, the programming the stored failed address in an anti-fuse array of the semiconductor memory device includes, reading the stored fail address from the first region, and programming the read fail address in the anti-fuse array.

According to at least one example embodiment of the inventive concepts, the method further includes encoding the determined fail address, wherein the storing the determined fail address in a first region of the memory cell array includes storing the encoded fail address in the first region.

According to at least one example embodiment of the inventive concepts, the encoding the determined fail address includes receiving the determined fail address at an error-correcting code (ECC) engine included in the test circuit; and encoding the determined fail address using the ECC engine.

According to at least one example embodiment of the inventive concepts, the method further includes retesting the semiconductor memory device by using the test circuit to perform a second test operation including determining whether or not one or more fail cells are included in the memory cell array, the second test operation being performed using a repair address, the repair address being an address generated by the anti-fuse array based on the fail address programmed into the anti-fuse array.

In exemplary embodiments, the test circuit is configured to perform a verify operation on the read fail address using the ECC engine while the read fail address is decoded.

In exemplary embodiments, the test circuit is configured to perform a verify operation on the data programmed in the anti-fuse array by comparing data programmed in the anti-fuse array with data read from the redundancy cell array.

In exemplary embodiments, the test circuit is configured to perform a retest on the memory cell array using the anti-fuse array in which the fail address is programmed.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
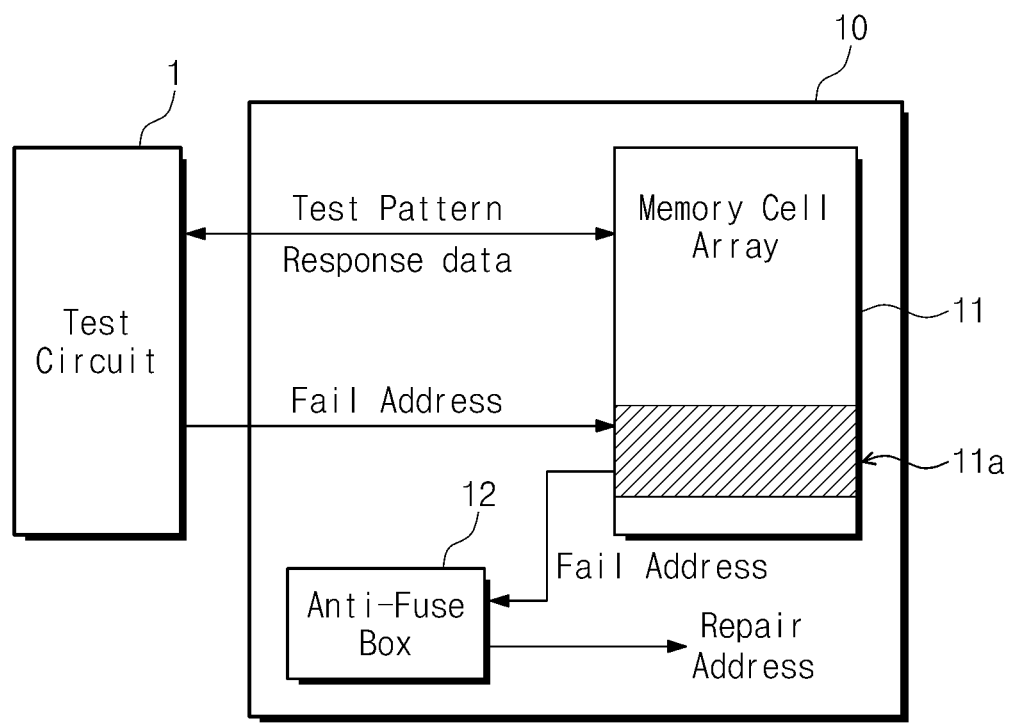
FIG. 1 is a block diagram illustrating a semiconductor memory system in accordance with at least some embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved FIG. 1 is a block diagram illustrating a semiconductor memory system in accordance with at least some example embodiments of the inventive concepts. Referring to FIG. 1, a semiconductor memory system includes a semiconductor memory device 10 and a test circuit 1. The semiconductor memory device 10 is connected to the test circuit 1 that controls a test operation with respect to the semiconductor memory device 10.

Since the semiconductor memory device 10 can consistently store a fail address being detected in the process of a failed cell test, an additional memory for storing a fail address in the process of the test is not needed.

The semiconductor memory device 10 is a device to store data. The semiconductor memory device 10 can be embodied in many different forms. The semiconductor memory device 10 may be a dynamic random access memory (DRAM) including, for example, one or more of a double data rate synchronous dynamic random access memory (DDR SDRAM), a low power double data rate (LPDDR) SDRAM, a graphics double data rate (GDDR) SDRAM, a rambus dynamic random access memory (RDRAM), etc. The semiconductor memory device 10 includes a memory cell array 11 and an anti-fuse box 12.

The memory cell array 11 includes a plurality of memory cells for storing data. The memory cells may be volatile memory cells. For example, each memory cell may be a volatile memory cell including one access transistor and one storage capacitor. Each memory cell may also be a gain cell including a plurality of transistors. However, according to at least some example embodiments of the inventive concepts, a constitution of the memory cells is not limited to the described example.

The memory cell array 11 may include a normal cell array and a redundancy cell array for replacing failed cells included in the normal cell array. Normal cells included in the normal cell array and redundancy cells included in the redundancy cell array may have the same physical characteristics. Failed cells are cells that do not operate properly. One example of a failed cell is cell that does not store data properly.

The memory cell array 11 may include a fail address memory region 11a for storing a fail address. A relative location of the fail address memory region 11a in the memory cell array 11 can be controlled by the test circuit 1.

The test circuit 1 controls a test operation for detecting failed cells included in the memory cell array 11. The test circuit 1 controls a repair operation on the detected failed cells. The test circuit 1 may include a built in self test (BIST) circuit for testing the memory cell array 11 and a built in self repair (BISR) circuit for performing a self repair using a test result obtained by the BIST circuit.

The test circuit 1 can perform a test operation on the memory cell array 11 using a variety of test patterns. If the test circuit 1 provides a desired or, alternatively, predetermined or, alternatively, reference test pattern, response data is read from the memory cell array 11 in response to the test pattern. The test circuit 1 can detect failed cells using the response data.

The test circuit 1 can temporarily store an address (hereinafter it is referred to as a fail address) of the detected failed cells. That is, the test circuit 1 can be used by the memory cell array 11 as a buffer memory for storing a fail address being detected in the test process.

As described above, the test circuit 1 can designate a location of a fail address memory region 11a in the memory cell array 11. The test circuit 1 can select the fail address memory region 11a on the basis of previously designated address. The test circuit 1 can select the fail address memory region 11a on the basis of a test pattern to be provided to the memory cell array 11. However, this is only an illustration and a method by which the test circuit 1 selects the fail address memory region 11a is not limited to the described illustration.

The test circuit 1 can be designated so that the fail address memory region 11a is included in a redundancy cell area. In the case that the fail address memory region 11a is included in a redundancy cell area, the test circuit 1 can perform a pin setting operation and a physical address mapping setting operation for accessing the redundancy cell area.

The test circuit 1 can read a fail address stored in the fail address memory region 11a. The test circuit 1 can program the read fail address in the anti-fuse box 12.

The anti-fuse box 12 includes a nonvolatile memory. The nonvolatile memory is embodied by an anti-fuse array. However, this is only an illustration and the nonvolatile memory included in the anti-fuse box 12 can be embodied in many different forms. The fail address stored in the fail address memory region 11a of the memory cell array 11 is read to be programmed in the nonvolatile memory of the anti-fuse box 12.

When a read/write operation with respect to the memory cell array 11 is performed, if an address (hereinafter it is referred to as a fail address) of one or more failed cells is input, the anti-fuse box 12 outputs a repair address corresponding to the fail address. The repair address is an address of redundancy cells replacing the detected failed cells. A read/write operation with respect to redundancy cells is performed in response to a repair address being provided from the anti-fuse box 12. Through those operations described above, failed cells included in the memory cell array 11 can be replaced with redundancy cells.

The semiconductor memory device 10, in the process of a failed cell test, can continuously store a fail address being detected in the memory cell array 11 before programming the fail address being detected. Since the semiconductor memory device 10 does not need an additional memory for storing a fail address in the process of a test, the semiconductor memory device 10 can be embodied by a small area.

Figure 2:
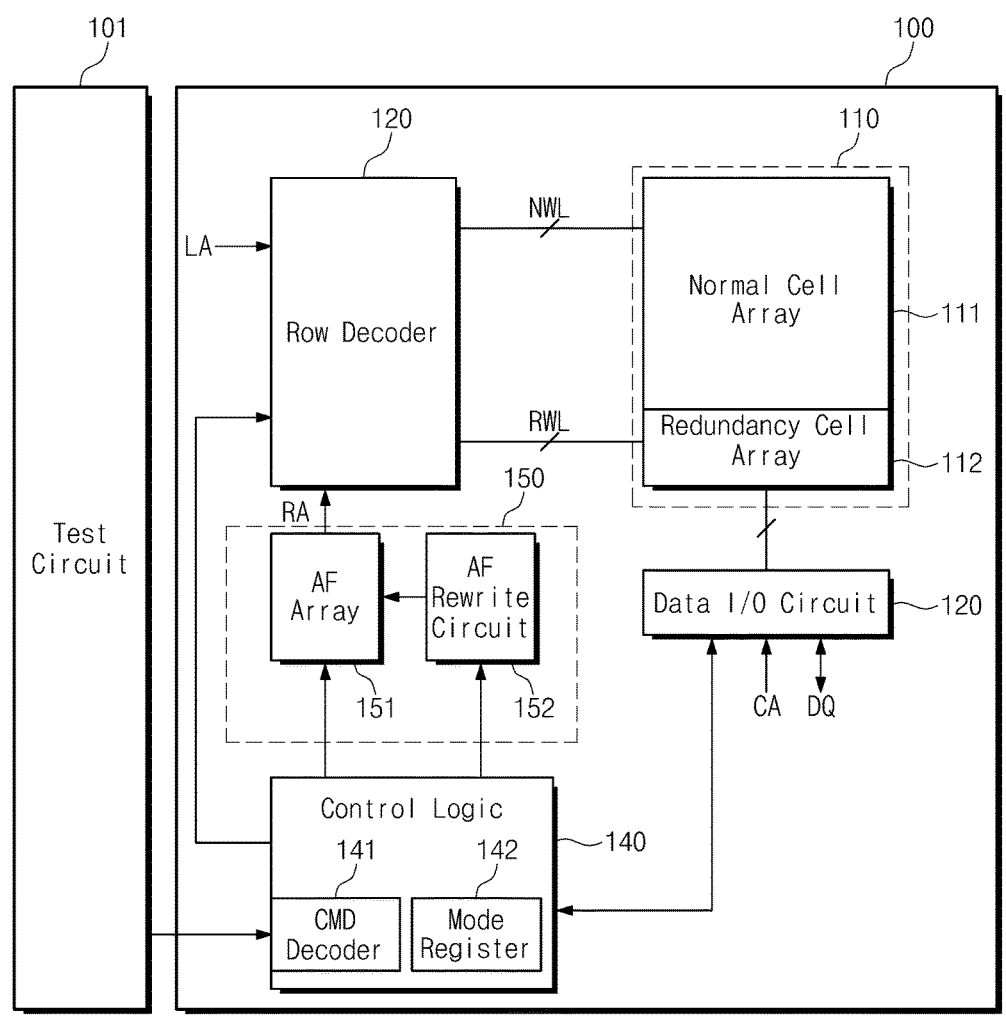
FIG. 2 is a block diagram illustrating an embodiment of a semiconductor memory device of FIG. 1.

FIG. 2 is a block diagram illustrating an embodiment of a semiconductor memory device of FIG. 1. Referring to FIG. 2, a semiconductor memory device 100 includes a memory cell array 110, a row decoder 120, a data input/output circuit 130, control logic 140, and an anti-fuse box 150. The semiconductor memory device 100 is connected to a test circuit 110.

Since the semiconductor memory device 100 can continuously store a fail address being detected in the process of a failed cell test in the memory cell array 110, the semiconductor memory device 100 does not require an additional memory for storing a fail address in the process of a test.

The memory cell array 110 may be constituted, for example, by a plurality of memory cells constituted in a matrix form. The memory cell array 110 includes a normal cell array 111 and a redundancy cell array 112.

The normal cell array 111 includes a plurality of normal cells for storing data. The plurality of normal cells are connected to the row decoder 120 through a normal word line NWL. The redundancy cell array 111 includes a plurality of redundancy cells for replacing failed cells of the normal cell array 111. The plurality of redundancy cells may have the same constitution and operation principle as the normal cells. The plurality of redundancy cells are connected to the row decoder 120 through a redundancy word line RWL.

In FIG. 2, the semiconductor memory device 100 is illustrated which replaces a normal word line with a redundancy word line to replace failed cells of the normal cell array 111. However, according to at least some example embodiments of the inventive concepts, the semiconductor memory device is not limited to this configuration. For example, to replace failed cells, the semiconductor memory device 100 may be configured to replace a column line of the normal cell array 111 with a column line of the redundancy cell array 112.

The row decoder 120 decodes a row address LA provided through an address buffer to select a part of word lines of the memory cell array 111. The row decoder 120 selects a part of the normal word line NWL and the redundancy word line RWL using the decoded row address LA and a repair address RA provided from the anti-fuse box 150.

The data input/output circuit 130 decodes a column address CA provided through an address buffer to select a bit line of the memory cell array 111. The data input/output circuit 130 senses and amplifies data stored in a memory cell connected to a selected bit line. The data input/output circuit 130 can buffer write data DQ being applied from the outside to store buffered write data in a selected memory cell. The data input/output circuit 130 can buffer data read from a memory cell to output the read data to the output.

The control logic 140 can control an operation of the semiconductor memory device 100. For example, the control logic 140 can generate control signals so that the semiconductor memory device 100 performs a write operation or a read operation. The control logic 140 can operate in response to a control of the test circuit 101 during a test operation.

The control logic 140 can receive a command from the test circuit 101. The control logic 140 may include a command decoder 141 decoding a command CMD being received from the test circuit 101 or the outside and a mode register 142 for setting an operation mode of the semiconductor memory device 100. The command decoder 141 of the control logic 140 can decode a write enable signal (/WE), a row address strobe signal (/RAS), a column address strobe signal (/CAS), a chip selection signal (/CS), etc. to generate control signals corresponding to the command CMD.

The anti-fuse circuit 150 stores a fail address. The anti-fuse circuit 150 generates a repair address for a repair operation on the basis of the stored fail address to provide the repair address to the row decoder 120. The anti-fuse circuit 150 includes an anti-fuse array 151 and an anti-fuse rewrite circuit 152.

The anti-fuse array 151 is a nonvolatile memory for storing a fail address. The anti-fuse array 151 provides a repair address RA to the row decoder 120 on the basis of the stored fail address under the control of the control logic 140. If a fail address is input when a write or read operation is performed, a word line connected to the redundancy cell array 112 is selected instead of a word line corresponding to a fail address by the repair address RA. In illustrated embodiments, the anti-fuse array 151 is embodied by an anti-fuse, however at least some example embodiments of the inventive concepts are not limited to this arrangement. For example, the anti-fuse array 151 can be replaced with a nonvolatile memory such as a flash memory.

The anti-fuse rewrite circuit 152 is a rewrite circuit for programming the anti-fuse array 151. The anti-fuse rewrite circuit 152 programs a fail address in the anti-fuse array 151 under the control of the control logic 140. The anti-fuse rewrite circuit 152 can electrically cut, or alternatively, short, a fuse corresponding to a word line being connected with a memory cell judged to be a failed cell among fuses included in the anti-fuse array 151 under the control of the control logic 140.

The test circuit 101 tests and repairs failed cells included in the memory cell array 110. The test circuit 101 may include a built in self test (BIST) circuit for testing the memory cell array 110 and a built in self repair (BISR) for performing self repair using a test result by the BIST circuit.

The test circuit 101 can perform a test operation on the memory cell array 110 using various test patterns. Response data is read from the memory cell array 110 in response to the test patterns provided by the test circuit 101. The test circuit 101 can detect a fail address using the response data.

The test circuit 101 can control the control logic 140 so that the detected fail address is temporarily stored in the memory cell array 110. The test circuit 101 can use the memory cell array 110 as a buffer memory for storing a fail address being detected in the process of a test.

The test circuit 101, in the memory cell array 110, can select a location of a fail address memory region in which a fail address will be stored. The test circuit 101 can select the fail address memory region on the basis of the desired or, alternatively, predetermined address. The test circuit 101 can select the fail address memory region on the basis of a test pattern to be provided to the memory cell array 110. However, this is only an illustration and a method by which the test circuit 101 selects the fail address memory region is not limited to the example described above.

The test circuit 101 can designate, as the fail address memory region, a portion of the redundancy cell array 112. The test circuit 101 can use a redundancy cell array 112 area as a buffer memory to more effectively perform a test operation.

Figure 3:
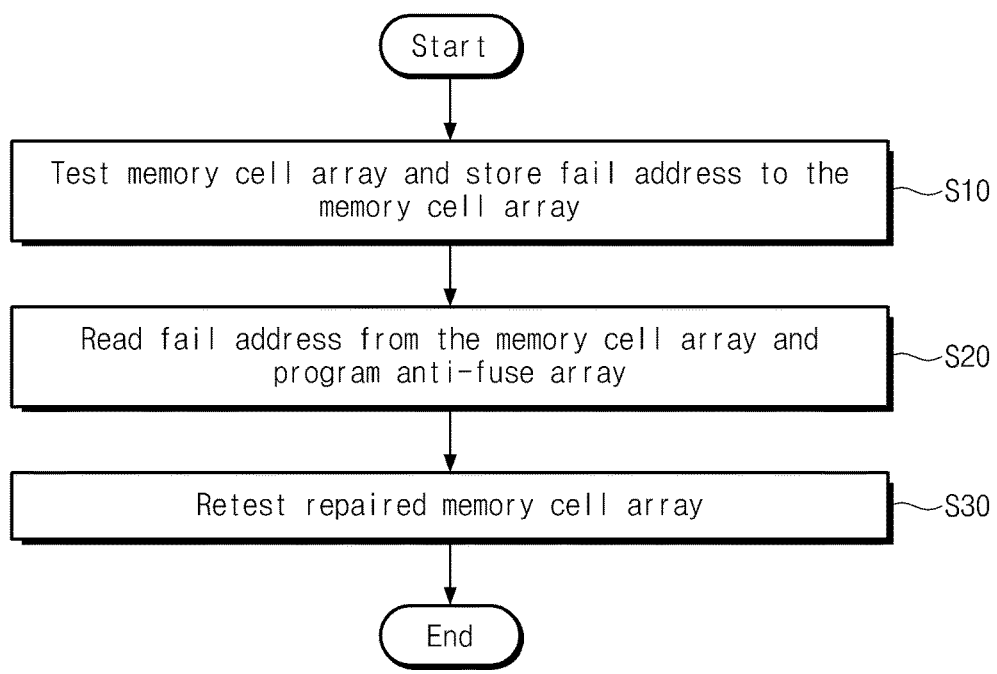
FIG. 3 is a flow chart illustrating a test operation of a semiconductor memory device in accordance with at least some embodiments of the inventive concepts.

FIG. 3 is a flow chart illustrating a test operation of a semiconductor memory device in accordance with at least some embodiments of the inventive concepts. Referring to FIG. 3, a semiconductor memory device can use a memory cell array of the semiconductor memory device as a buffer memory for storing a fail address being detected in the process of a test.

In a step S10, a memory cell array included in the semiconductor memory device is tested, for example, by the test circuit 1. While a test operation is performed, one or more failed cells included in the memory cell array are determined, for example, by the test circuit 1. A fail address corresponding to the one or more determined failed cells is generated, for example, by the test circuit 1. According to at least one example embodiment, by the test circuit 1 may cause the generated fail address to be stored in a desired or, alternatively, predetermined area of the memory cell array. The desired or, alternatively, predetermined area in which the fail address is stored may be included in a redundancy cell area of the memory cell array.

In a step S20, a fail address stored in the memory cell array is read, for example, by the test circuit 1. The read fail address is programmed in an anti-fuse array, for example, by the test circuit 1.

In a step S30, the memory cell array is repaired based on the fail address programmed in the anti-fuse array, for example, by the test circuit 1. In response to a control of the test circuit, a retest operation with respect to the repaired memory cell array is performed, for example, by the test circuit 1. During a retest operation, the test circuit 1 may verify whether failed cells of the memory cell array are ordinarily repaired or not.

According to the test operation of the semiconductor memory device described above, the semiconductor memory device can use the memory cell array of the semiconductor memory device as a buffer memory for storing a fail address being detected in the process of the test. Since the test operation can be performed without an additional buffer memory for the test operation, the semiconductor memory device and a test circuit can be embodied by a small area.

Figure 4:
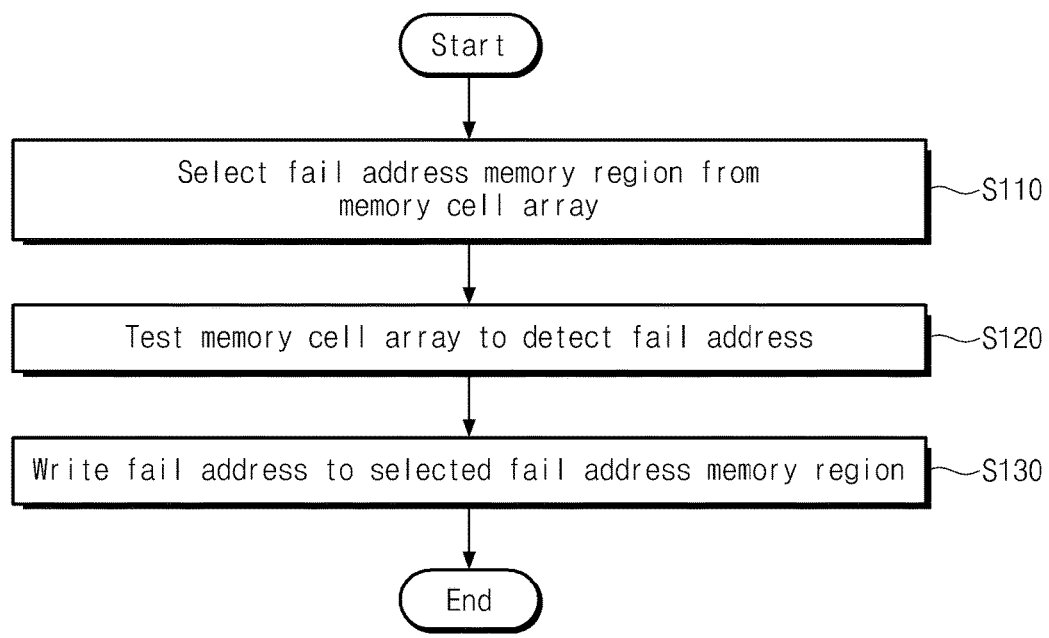
FIG. 4 is a flow chart illustrating an embodiment of step S10 of the test operation illustrated in FIG. 3.

FIG. 4 is a flow chart illustrating an embodiment of step S10 of the test operation of FIG. 3. Referring to FIG. 4, in a step S110, a fail address memory region in which a fail address will be stored is selected from the memory cell array, for example, by the test circuit 1. According to at least one example embodiment of the inventive concepts, a method of selecting the fail address memory region is not limited. The fail address memory region can be selected based on a desired or, alternatively, predetermined address. The fail address memory region can also be selected based on a test pattern.

In a step S120, a test operation with respect to the memory cell array is performed, for example, by the test circuit 1. During the test operation, failed cells included in the memory cell array are detected. The failed cell indicates a defective cell for which a repair is required. A fail address corresponding to failed cells detected during the test operation is generated, for example, by the test circuit 1.

In a step S130, the fail address generated in the step S120 is stored in the fail address memory region selected in the step S110, for example, by the test circuit 1.

According to the test operation of the semiconductor memory device, the semiconductor memory device can use the memory cell array of the semiconductor memory device as a buffer memory for storing the fail address being detected in the process of the test. Since the test operation can be performed without an additional buffer memory for the test operation, the semiconductor memory device and the test circuit can be embodied by a small area.

Figure 5:
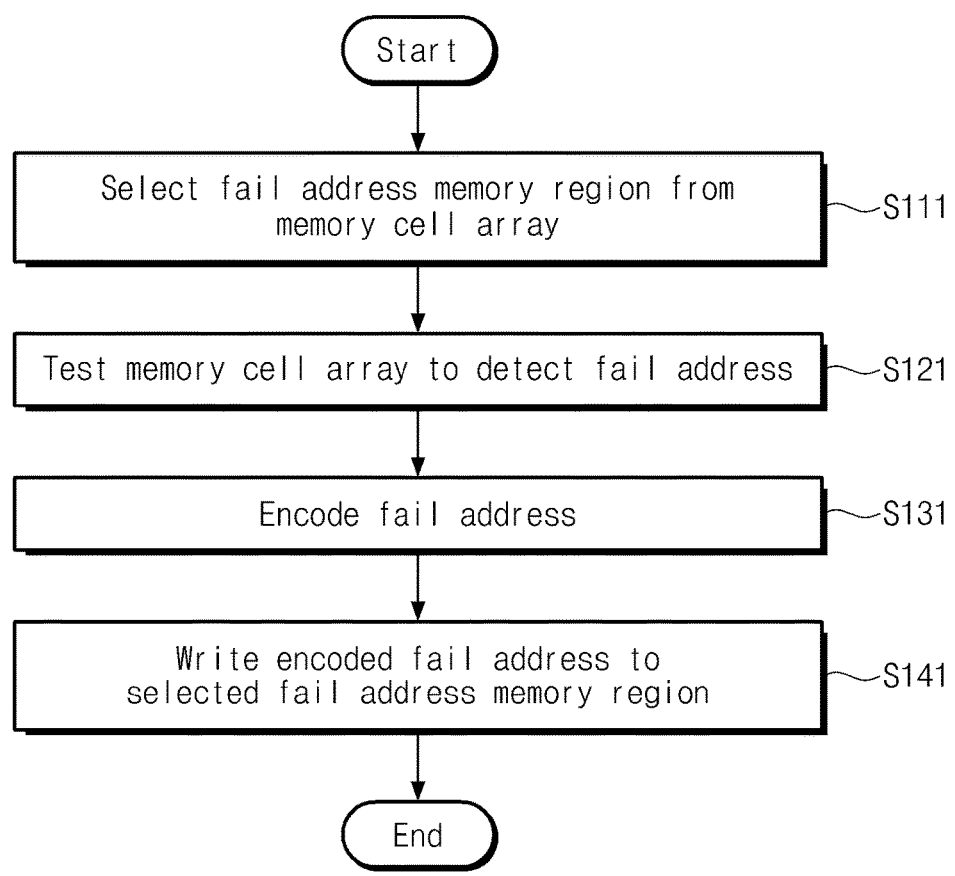
FIG. 5 is a flow chart illustrating another embodiment of step S10 of the test operation illustrated in FIG. 3.

FIG. 5 is a flow chart illustrating another embodiment of step S10 of the test operation of FIG. 3. Referring to FIG. 5, in a step S111, a fail address memory region in which a fail address will be stored is selected from the memory cell array. According to at least one example embodiment of the inventive concepts, a method of selecting the fail address memory region is not limited. The fail address memory region can be selected based on a desired or, alternatively, predetermined address. The fail address memory region can also be selected based on a test pattern.

In a step S121, a test operation with respect to the memory cell array is performed, for example, by the test circuit 1. During the test operation, failed cells included in the memory cell array are detected, for example, by the test circuit 1. The failed cell indicates a defective cell for which a repair is required. A fail address corresponding to failed cells detected during the test operation is generated, for example, by the test circuit 1.

In a step S131, the fail address generated in the step S121 is encoded. A fail address encoding operation can be performed using an error-correcting code (ECC) engine included in the test circuit, for example the test circuit 2. A fail address encoding operation can also be performed using an ECC engine included in the semiconductor memory device, for example the semiconductor memory device 30.

In a step S141, an encoded fail address is stored in the fail address memory region selected in the step S111, for example, by the test circuit 1.

According to the test operation of the semiconductor memory device, the semiconductor memory device can use the memory cell array of the semiconductor memory device as a buffer memory for storing the fail address being detected in the process of the test. In addition, the semiconductor memory device can improve or, alternatively, guarantee reliability of the stored fail address by performing an encoding operation with respect to the fail address.

Figure 6:
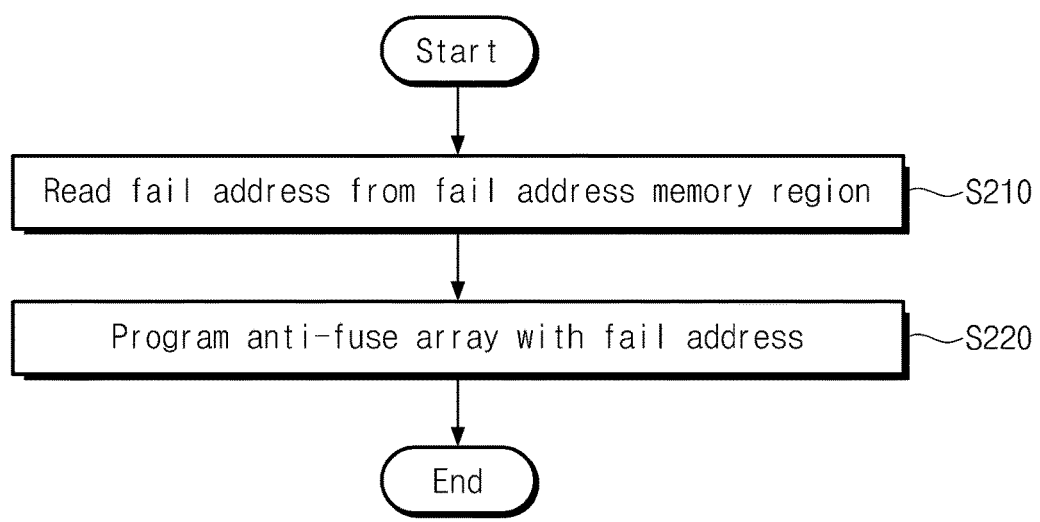
FIG. 6 is a flow chart illustrating an embodiment of step S20 of the test operation illustrated in FIG. 3.

FIG. 6 is a flow chart illustrating an embodiment of step S20 of the fail address read operation of FIG. 3. Referring to FIG. 6, in a step S210, a fail address stored in the fail address memory region is read, for example, by the test circuit 1. In exemplary embodiments, a fail address read operation can be performed after fail addresses of the memory cell array are all stored in the fail address memory region, for example, by the test circuit 1. The fail address read operation can be repeatedly performed whenever a desired or, alternatively, predetermined amount of fail address is stored in the fail address memory region. In the case that the fail address read operation is repeatedly performed, the fail address read operation can be performed in a pipeline form.

In a step S220, the fail address read in the step S210 is programmed in an anti-fuse array, for example, by the test circuit 1. The fail address stored in the anti-fuse array is used as a repair address when a read or write operation with respect to the semiconductor memory device is performed.

According to the test operation of the semiconductor memory device, the semiconductor memory device can be embodied by a small area by using the fail address memory region of the memory cell array as a buffer memory before programming the fail address in the anti-fuse array.

Figure 7:
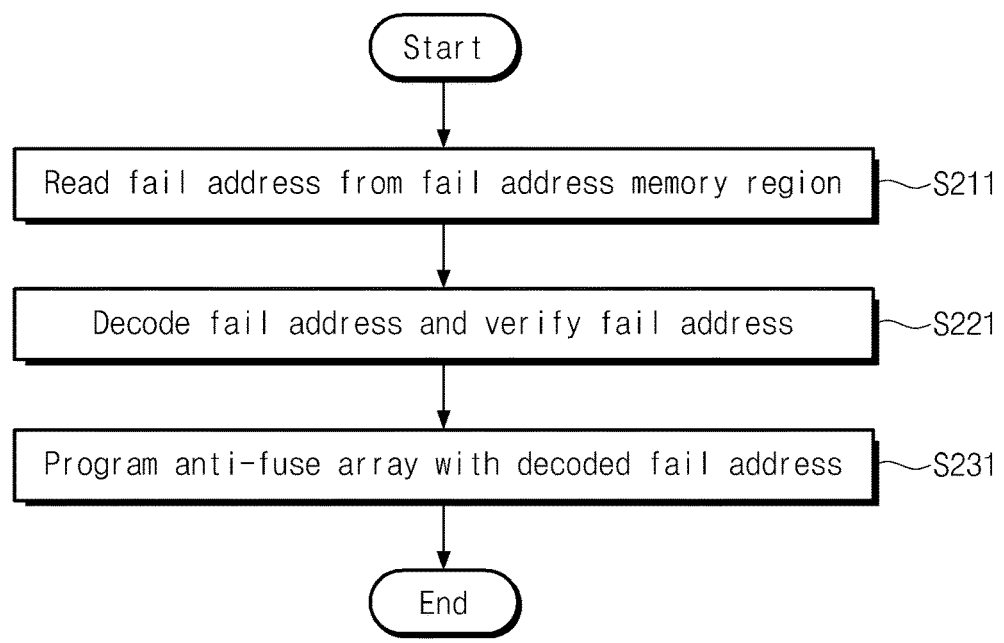
FIG. 7 is a flow chart illustrating another embodiment of step S20 of the test operation illustrated in FIG. 3.

FIG. 7 is a flow chart illustrating another embodiment of step S20 of FIG. 3. Referring to FIG. 7, in a step S211, a fail address stored in the fail address memory region is read, for example, by the test circuit 1. A fail address read operation of the step S211 can have the same constitution as the fail address read operation of the step S210 of FIG. 6.

In a step S221, a decoding operation with respect to the fail address read in the step S211 is performed. The fail address read in the step S211 may be a fail address which is encoded to be stored. If a decoding operation is finished, a verify operation with respect to the decoded fail address is performed, for example, by the test circuit 1. The verify operation can be performed on the basis of various ICC logics.

The fail address decoding operation can be performed using an ECC engine included in the test circuit, for example the test circuit 2. The fail address decoding operation can also be performed using an ECC engine included in the semiconductor memory device, for example the semiconductor memory device 30.

In a step S231, the verified fail address is programmed in an anti-fuse array, for example, by the test circuit 1.

According to the test operation of the semiconductor memory device described above, the semiconductor memory device can be embodied by a small area using the fail address memory region of the memory cell array before programming the fail address in the anti-fuse array. In addition, the semiconductor memory device can improve or, alternatively, guarantee reliability of the fail address through an operation of decoding and verifying the fail address.

Figure 8:
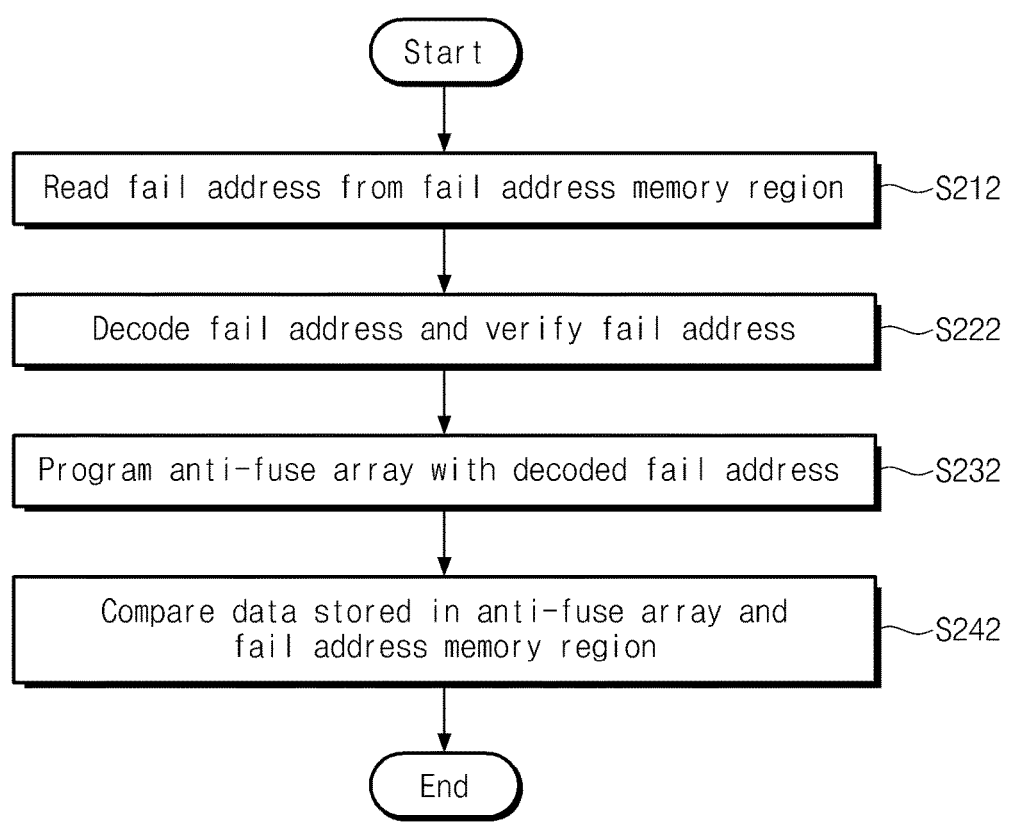
FIG. 8 a flow chart illustrating still another embodiment step S20 of the test operation illustrated in FIG. 3.

FIG. 8*a* flow chart illustrating still another embodiment of step S20 of the test operation of FIG. 3. Referring to FIG. 8, in a step S212, a fail address stored in the fail address memory region is read, for example, by the test circuit 1. A fail address read operation of the step S212 can have the same constitution as the fail address read operation of the step S210 of FIG. 6.

In a step S222, a decoding operation and a verify operation are performed on the fail address read in the step S212. The decoding and verifying operations of the step S222 may have the same constituent principle as the operation of the step S211 of FIG. 7. For example, the decoding and verifying operations of the step S222 may be performed in the same manner as that describe above with respect to step S211 of FIG. 7

In a step S232, the verified fail address is programmed in the anti-fuse array, for example, by the test circuit 1.

In a step S242, data programmed in the anti-fuse array is read, for example, by the semiconductor memory device 10. The data read from the anti-fuse array and data stored in the fail address memory region are compared with each other. The semiconductor memory device can improve or, alternatively, guarantee reliability of the fail address by judging whether or not data stored in the anti-fuse array and the fail address memory region are the same.

According to the test operation of the semiconductor memory device described above, the semiconductor memory device performs a first verify operation of using the fail address encoding and decoding operations and a second verify operation of comparing data stored in the anti-fuse array and the fail address memory region. The semiconductor memory device can improve or, alternatively, guarantee reliability of the fail address using the first and second verify operations.

Figure 9:
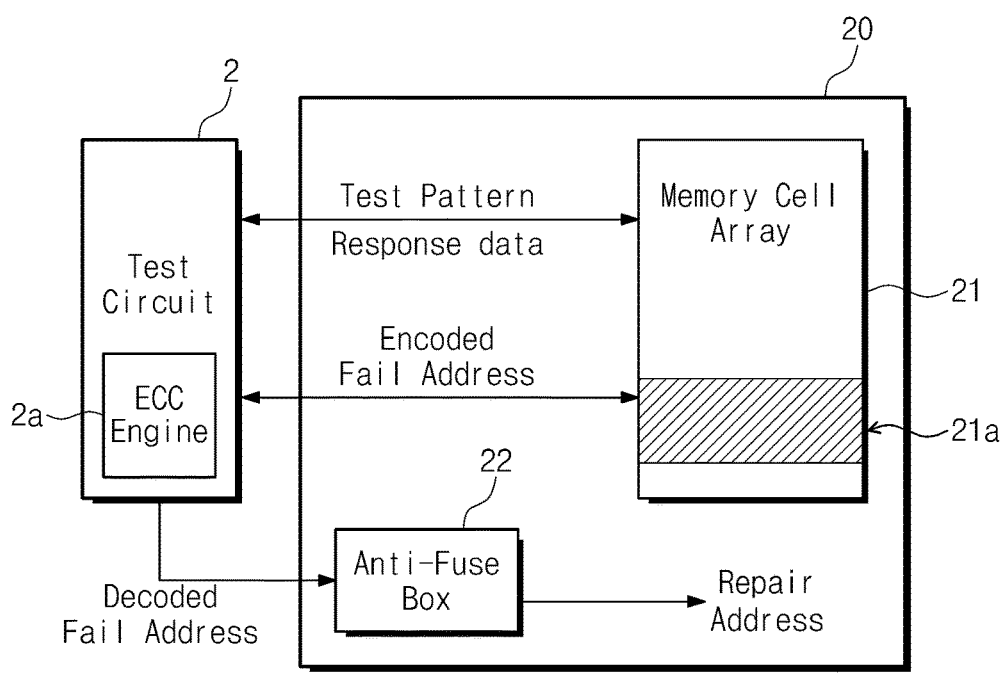
FIG. 9 is a block diagram illustrating an embodiment of a semiconductor memory device performing the test operation of illustrated in FIG. 5.

FIG. 9 is a block diagram illustrating an embodiment of a semiconductor memory device performing the test operation illustrated in FIG. 5. Referring to FIG. 9, a semiconductor memory device 20 of FIG. 9 is connected to a test circuit 2. The test circuit 2 includes an ECC engine 2a.

The test circuit 2 controls a test operation for detecting failed cells included in a memory cell array 21. The test circuit 2 controls a repair operation with respect to the detected failed cells.

The test circuit 2 can perform a test operation with respect to the memory cell array 21 using various test patterns. If the test circuit 2 provides a desired or, alternatively, predetermined test pattern, response data is read from the memory cell array 21 in response to the test pattern. The test circuit 2 can detect failed cells using the response data.

The test circuit 2 encodes an address (hereinafter it is referred to as a fail address) of the detected failed cells using the ECC engine 2a. The test circuit 2 can temporarily store the encoded fail address in the memory cell array 21. That is, the test circuit 2 can use the memory cell array 21 as a buffer memory for storing a fail address being detected in the process of a test. The test circuit 2 can store the encoded fail address in a desired or, alternatively, predetermined fail address memory region 21a of the memory cell array 21.

The test circuit 2 can read a fail address stored in the fail address memory region 21a. The test circuit 2 can perform a decoding operation with respect to the read fail address using the ECC engine 2a. The test circuit 2 can perform a verify operation with respect to the fail address in the process of decoding. The test circuit 2 can program the decoded fail address in an anti-fuse box 22.

The test circuit 2 and the semiconductor memory device 20 can continuously store a fail address being detected in the process of a failed cell test in the memory cell array 21 before programming the fail address in the anti-fuse box 22.

The test circuit 2 and the semiconductor memory device 20 can improve or, alternatively, guarantee reliability of the fail address using an encoding operation with respect to the fail address.

Figure 10:
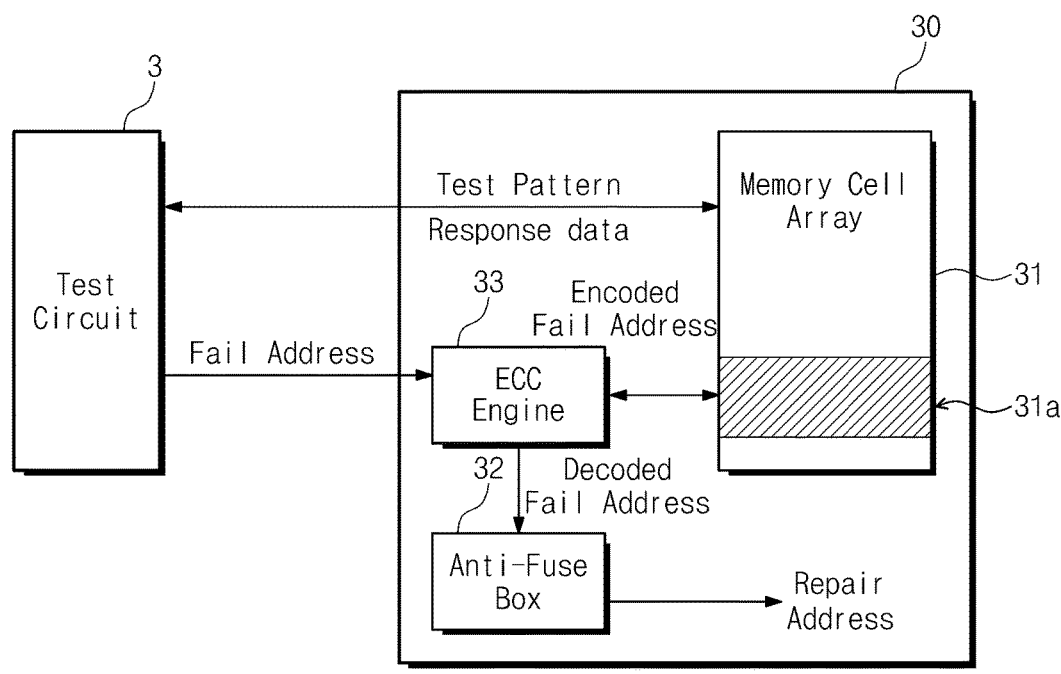
FIG. 10 is a block diagram illustrating another embodiment of a semiconductor memory device performing the test operation illustrated in FIG. 5.

FIG. 10 is a block diagram illustrating another embodiment of a semiconductor memory device performing the test operation illustrated in FIG. 5. Referring to FIG. 10, a semiconductor memory device 30 further includes an ECC engine 33 as compared with the semiconductor memory device 10 of FIG. 1.

Since the semiconductor memory device 30 can encode a fail address being detected in the process of a failed cell test to continuously store the encoded fail address in a memory cell array 31, the semiconductor memory device 30 can improve or, alternatively, guarantee of the stored fail address.

The test circuit 3 can perform a test operation with respect to the memory cell array 31 using various test patterns. If the test circuit 3 provides a desired or, alternatively, predetermined test pattern, response data is read from the memory cell array 31 in response to the test pattern. The test circuit 3 can detect failed cells using the response data.

The test circuit 3 can control the semiconductor memory device 30 so that an address (hereinafter it is referred to as a fail address) of one or more failed cells is stored in the memory cell array 31. In response to a control of the test circuit 3, the semiconductor memory device 30 can encode the fail address using the ECC engine 33 and then store the encoded fail address in a fail address memory region 31a of the memory cell array 31.

The test circuit 3 can read the fail address stored in the fail address memory region 31a. In response to a control of the test circuit 3, the semiconductor memory device 30 can decode the read fail address. The semiconductor memory device 30 can perform a verify operation with respect to the fail address in the process of decoding.

The test circuit 3 can control the semiconductor memory device 30 so that the decoded fail address is programmed in the anti-fuse box 32. When a read/write operation with respect to the memory cell array 31 is performed, if a fail address is input, the anti-fuse box 32 can output a repair address corresponding to the fail address.

The test circuit 3 and the semiconductor memory device 30 can continuously store a fail address being detected in the process of a failed cell test in the memory cell array 31 before programming the fail address in the anti-fuse box 32. The test circuit 3 and the semiconductor memory device 30 can improve or, alternatively, guarantee reliability of the fail address using encoding and decoding operations with respect to the fail address.

Figure 11A:
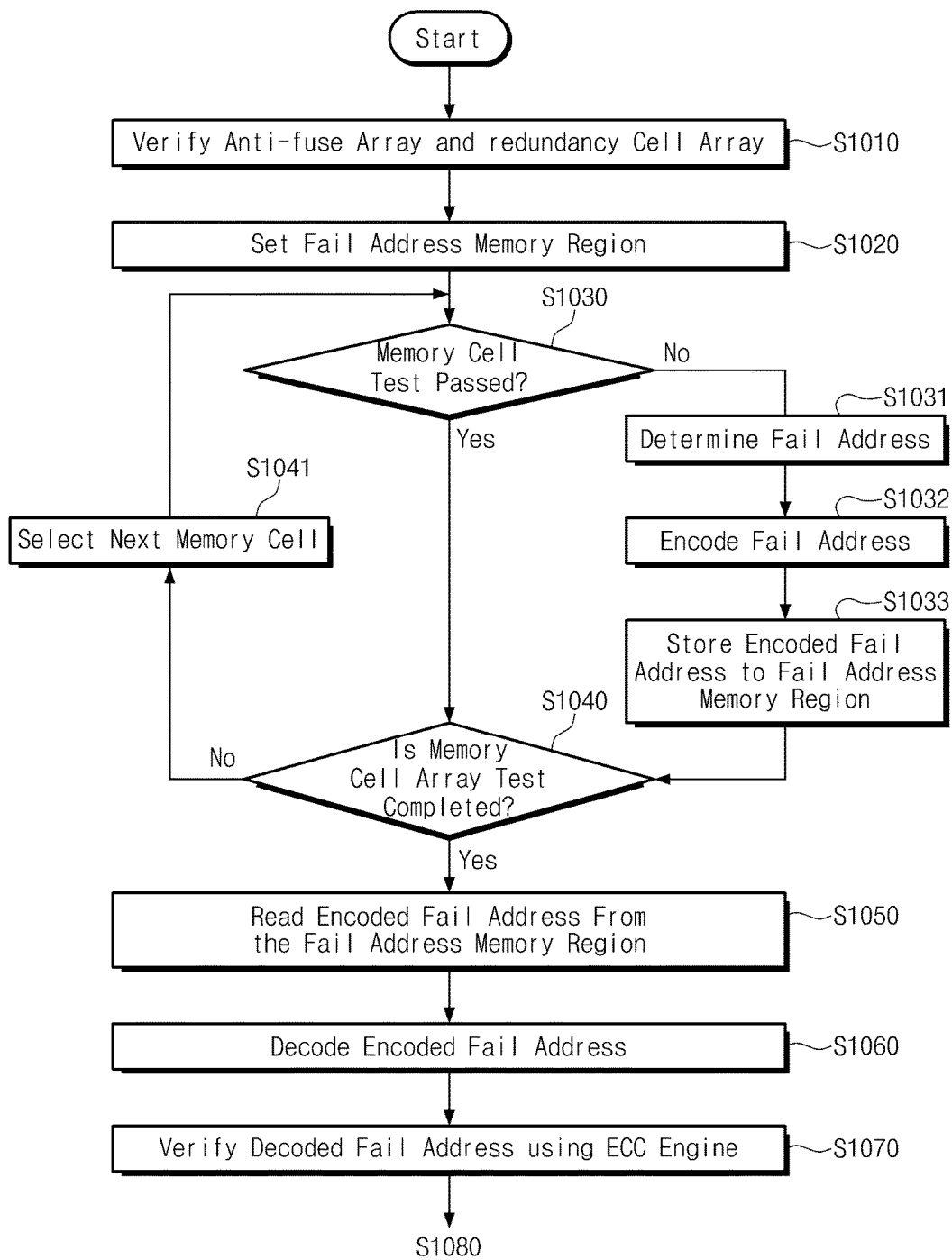
FIGS. 11A and 11B are flow charts illustrating a test method of a semiconductor memory device in accordance with at least some other embodiments of the inventive concepts.
Figure 11B:
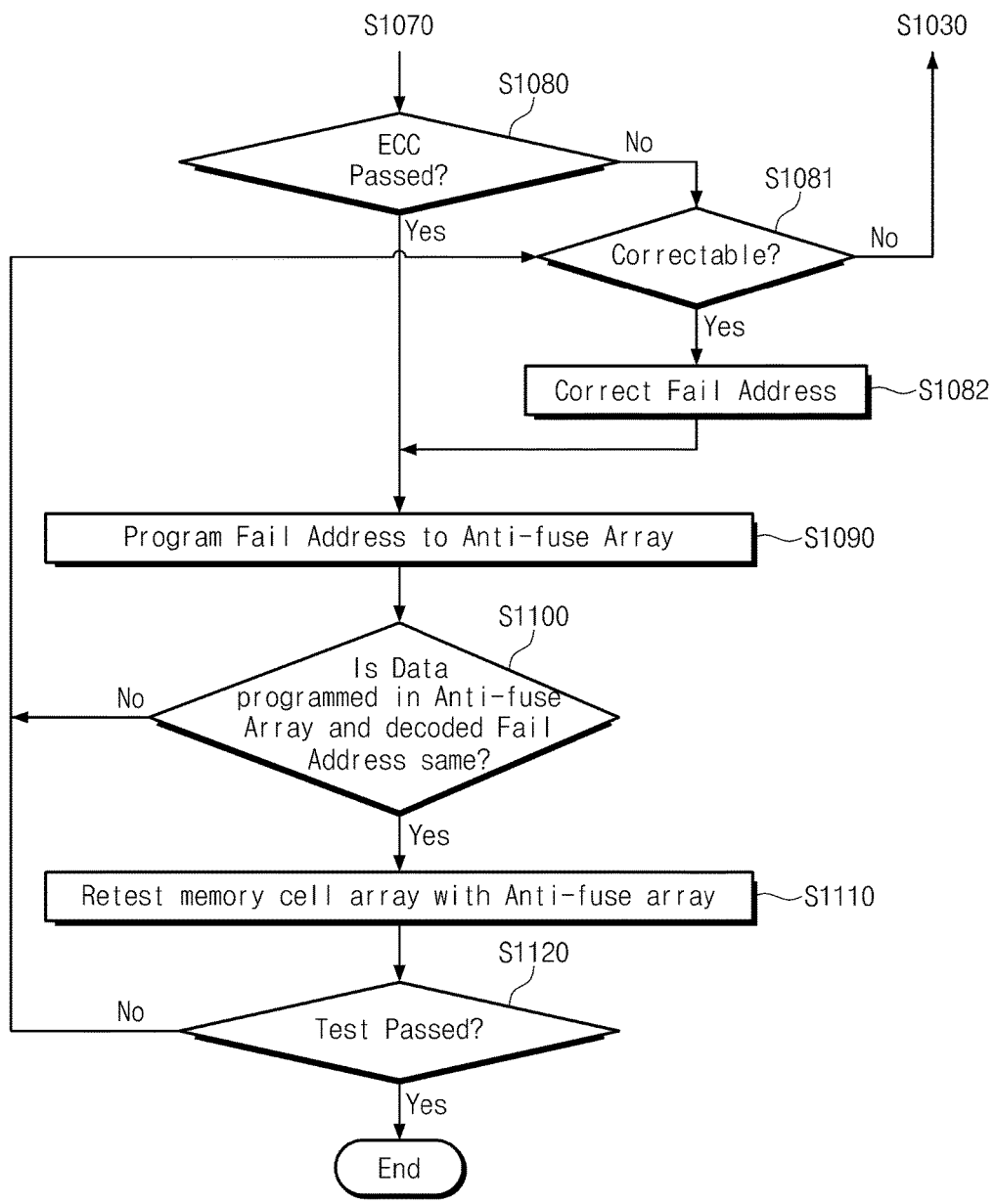

FIGS. 11A and 11B are flow charts illustrating a test method of a semiconductor memory device in accordance with at least some other embodiments of the inventive concepts. Referring to FIGS. 11A and 11B, a test circuit and a semiconductor memory device can use a memory cell array of a semiconductor memory device as a buffer memory for storing a fail address being detected in the process of testing. In addition, the test circuit and the semiconductor memory device can improve or, alternatively, guarantee reliability of a fail address using a three-step verify operation.

In a step S1010, an anti-fuse array of the semiconductor memory device and a redundancy cell array of a memory cell array are verified.

In a step S1020, a fail address memory region in which a fail address will be stored is set, for example, by the test circuit 1. The fail address memory region is located at the memory cell array of the semiconductor memory device. The fail address memory region may be located at the redundancy cell array.

In a step S1030, a test operation with respect to a memory cell of the memory cell array is performed, for example, by the test circuit 1. It is judged through the test operation whether or not the memory cell normally operates, for example, by the test circuit 1.

If the memory cell is determined to be a failed cell, in a step S1031, a fail address corresponding to the memory cell determined to be a failed cell is determined, for example, by the test circuit 1.

In a step S1032, the determined fail address is encoded. Through a fail address encoding operation, reliability of the fail address can be improved or, alternatively, guaranteed. The fail address encoding operation can be performed by an ECC engine included in the semiconductor memory device, for example the semiconductor memory device 30. The fail address encoding operation may also be performed by an ECC engine included in the test circuit, for example the test circuit 2.

In a step S1033, the encoded fail address is stored in the fail address memory region set in the step S1020, for example, by the test circuit 1 or the semiconductor memory device 10.

In a step S1040, it is determined whether a test operation with respect to the memory cell array is completed or not, for example, by the test circuit 1. If a memory cell which has to be tested exists, in a step S1041, a next memory cell is selected and a test operation is performed again on the next memory cell.

In a step S1050, in response to a control of the test circuit, for example the test circuit 1, the encoded fail address is read from the fail address memory region, for example by the semiconductor memory device 10.

In a step S1060, a decoding operation with respect to the encoded fail address is performed. The fail address decoding operation can be performed by an ECC engine included in the semiconductor memory device, for example the semiconductor memory device 30. The fail address decoding operation can also be performed by the ECC engine included in the test circuit, for example the test circuit 2.

In a step S1070, a first verify operation is performed. The first verify operation judges whether or not an error exists in a fail address read using, for example, the ECC engine of the test device 2 or the semiconductor device 3 to verify the fail address.

Based on the results of the first verify operation, in step S1080 an ECC operation is considered to be passed if no error exists, and the method proceeds to step S1090, which will be discussed below. Further, based on the results of the first verify operation, in step S1080 the ECC operation is considered not to be passed if an error exists, and the method proceeds to step S1081.

If the ECC operation is not passed, in a step S1081, it is determined, for example by the ECC engine of the test device 2 or the semiconductor device 3, whether or not the error is correctable. If the error is uncorrectable, the process is performed again from the memory test operation of the step S1030.

If the error is correctable, in a step S1082, a correction operation with respect to the fail address is performed, for example by the ECC engine of the test device 2 or the semiconductor device 3.

In a step S1090, the fail address read from the fail address memory region is programmed in the anti-fuse array, for example, by the test circuit 1 or the semiconductor memory device 10.

In a step S1100, a second verify operation is performed, for example, by the test circuit 1 or the semiconductor memory device 10. The second verify operation is an operation that judges whether or not a fail address decoded and read from the fail address memory region, and data programmed in the anti-fuse array are the same.

If the data are not the same, in a step S1081, it is determined whether or not the error is correctable, for example by the ECC engine of the test device 2 or the semiconductor device 3. If the error is uncorrectable, the process is performed again from the memory test operation of the step S1030. If the error is correctable, in a step S1082, a correction operation with respect to the fail address is performed, for example by the ECC engine of the test device 2 or the semiconductor device 3.

In a step S1110, a third verify operation is performed. The third verify operation retests the repaired memory cell array using the anti-fuse array to verify the fail address.

In a step S1120, it is determined whether or not a memory retest is passed. If an error occurs during the test operation, in the step S1081, it is determined whether or not the error is correctable, for example by the ECC engine of the test device 2 or the semiconductor device 3. If the error is uncorrectable, the process is performed again from the memory test operation of the step S1030. If the error is correctable, in a step S1082, a correction operation with respect to the fail address is performed, for example by the ECC engine of the test device 2 or the semiconductor device 3. If the memory retest is passed, a test operation with respect to the semiconductor memory device is completed.

Since the semiconductor memory device can encode a fail address being detected in the process of a failed cell test to continuously store the encoded fail address in the memory cell array, reliability of the stored fail address can be improve or, alternatively, guaranteed. In addition, the test circuit and the semiconductor memory device can improve or, alternatively, guarantee reliability of the fail address using a three-step verify operation.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A test method of a semiconductor memory device including a memory cell array and an anti-fuse array comprising:
   detecting one or more failed cells included in the memory cell array;
   determining a fail address corresponding to the detected one or more failed cells;
   encoding the determined fail address using an error-correcting code (ECC) engine included in the semiconductor memory device;
   storing the encoded fail address in a first region of the memory cell array;
   reading the stored fail address stored in the first region;
   decoding and verifying the read fail address using the ECC engine;
   when the verification is successful, programming the read fail address in the anti-fuse array; and when the verification is not successful, correcting the read fail address using the ECC engine, and programming the corrected fail address in the anti-fuse array.

2. The test method of claim 1, wherein the first region is included in a redundancy cell array.

3. The test method of claim 2, further comprising:

performing a pin setting operation to access the first region.

4. The test method of claim 1, wherein the decoding of the read fail address includes generating a decoded fail address by decoding the read fail address, and the verifying of the read fail address includes determining whether or not an error exists in the read fail address during the decoding of the read fail address.

5. The test method of claim 1, further comprising:

comparing data programmed in the anti-fuse array with data read from the first region to verify whether or not an error exists in the data programmed in the anti-fuse array.

6. The test method of claim 1, further comprising:

generating a repair address using the programmed anti-fuse array; and retesting whether failed cells included in the memory cell array are repaired using the repair address.

7. The test method of claim 1, wherein the correcting of the read fail address comprises:

determining that the read fail address includes a correctable error, using the ECC engine; and correcting the correctable error, using the ECC engine, when the read fail address is determined to include the correctable error.

8. A semiconductor memory system comprising:

a semiconductor memory device including a memory cell array and an anti-fuse array; and a test circuit configured to, detect a fail address corresponding to failed cells in the memory cell array, the test circuit including an error-correcting code (ECC) engine configured to, encode the detected fail address, and control the semiconductor memory device so that the encoded fail address is stored in a redundancy cell array included in the memory cell array, the test circuit being further configured to, read the stored fail address, decode and verify the read fail address using the ECC engine, when the verification is successful, program the read fail address in the anti-fuse array, and when the verification is not successful, correct the read fail address using the ECC engine, and program the corrected fail address in the anti-fuse array.

9. The semiconductor memory system of claim 8, wherein the test circuit is configured such that the decoding includes generating a decoded fail address by decoding the stored fail address read from the redundancy cell array using the ECC engine.

10. The semiconductor memory system of claim 9, wherein the test circuit is configured to perform the verifying of the read fail address using the ECC engine while the read fail address is decoded.

11. The semiconductor memory system of claim 8, wherein the test circuit is configured to perform a verify operation on data programmed in the anti-fuse array by comparing the data programmed in the anti-fuse array with data read from the redundancy cell array.

12. The semiconductor memory system of claim 8, wherein the test circuit is configured to perform a retest on the memory cell array using the anti-fuse array in which the fail address is programmed.

13. The semiconductor memory system of claim 8, wherein the ECC engine is further configured such that the correcting of the read fail address includes:

determining that the read fail address includes a correctable error, using the ECC engine; and correcting the correctable error, using the ECC engine, when the read fail address is determined to include the correctable error.

14. A method of operating a semiconductor memory device test circuit comprising:

performing a first test operation by using the test circuit to detect one or more failed cells included in a memory cell array of a semiconductor memory device;

determining a fail address corresponding to the detected one or more failed cells;

receiving the determined fail address at an error-correcting code (ECC) engine included in the test circuit;

encoding the determined fail address using the ECC engine;

storing the encoded fail address in a first region of the memory cell array;

reading the stored fail address;

decoding and verifying the read fail address using the ECC engine;

when the verification is successful, programming the read fail address in an anti-fuse array of the semiconductor memory device; and when the verification is not successful, correcting the read fail address using the ECC engine, and programming the corrected fail address in the anti-fuse array.

15. The method of claim 14, further comprising:

retesting the semiconductor memory device by using the test circuit to perform a second test operation including determining whether or not one or more fail cells are included in the memory cell array, the second test operation being performed using a repair address, the repair address being an address generated by the anti-fuse array based on the fail address programmed into the anti-fuse array.

16. The method of claim 14, wherein the correcting of the read fail address comprises:

determining that the read fail address includes a correctable error, using the ECC engine; and correcting the correctable error, using the ECC engine, when the read fail address is determined to include the correctable error.

* * * * *